United States Patent
Arai et al.

[11] Patent Number: 6,139,978
[45] Date of Patent: Oct. 31, 2000

[54] SEMICONDUCTOR ENCAPSULATING EPOXY RESIN COMPOSITIONS, AND SEMICONDUCTOR DEVICES ENCAPSULATED THEREWITH

[75] Inventors: Kazuhiro Arai; Kazutoshi Tomiyoshi; Toshio Shiobara, all of Gunma-ken, Japan

[73] Assignee: Shin-Etsu Chemical Co., Ltd., Tokyo, Japan

[21] Appl. No.: 09/223,373

[22] Filed: Dec. 30, 1998

[30] Foreign Application Priority Data

Jan. 12, 1998 [JP] Japan .................................. 10-016353

[51] Int. Cl.⁷ .................................................. H01L 29/12
[52] U.S. Cl. ......................... 428/620; 523/451; 525/500; 525/523; 528/89
[58] Field of Search ........................... 523/451; 525/500; 525/523; 528/89; 428/620

[56] References Cited

U.S. PATENT DOCUMENTS 4,572,853  2/1986  Ikeya et al. ................................ 428/76

FOREIGN PATENT DOCUMENTS 8259666A  10/1996  Japan .

OTHER PUBLICATIONS

Wells, Semiconductor International, pp. 214–218 (May 1989).

Nikkei Microdevices, pp. 66–67 (Jul. 1987) (no translation is currently available).

*Primary Examiner*—Robert Dawson
*Assistant Examiner*—D. Aylward
*Attorney, Agent, or Firm*—Birch, Stewart, Kolasch & Birch, LLP

[57] ABSTRACT

Epoxy resin compositions comprising (A) a polyfunctional epoxy resin, (B) a polyfunctional phenolic resin curing agent, (C) an organophosphorus curing accelerator, (D) an aminosilane coupling agent, and (E) an inorganic filler have excellent flow properties, shelf stability and curing speed and are thus suitable for semiconductor encapsulation, especially BGA encapsulation. Semiconductor devices encapsulated with the epoxy resin compositions are highly reliable.

2 Claims, 1 Drawing Sheet

SHEAR RATE (1mm/sec)

SEMICONDUCTOR ENCAPSULATING EPOXY RESIN COMPOSITIONS, AND SEMICONDUCTOR DEVICES ENCAPSULATED THEREWITH

BACKGROUND OF THE INVENTION

1. Field of the Invention

The present invention relates to epoxy resin compositions for semiconductor encapsulation. The invention relates also to semiconductor devices encapsulated with these compositions in a cured state, and especially BGA packages.

2. Prior Art

Resin-encapsulated devices currently predominate in the semiconductor industry. Epoxy resins are generally superior to other thermosetting resins in terms of such properties as moldability, adhesion, electrical characteristics, mechanical characteristics, and moisture resistance, and so epoxy resin compositions are commonly used for the encapsulation of semiconductor devices.

Ball grid array (BGA) packages, developed fairly recently by Motorola, have a distinctive structure in which the chip is mounted directly onto the circuit board substrate, and the top of the chip is encapsulated in plastic. In BGA packages, only one side of the substrate is resin encapsulated. Hence, the difference in shrinkage factor between the substrate and the resin leads to warping of the package, which is a major problem.

A number of attempts have been made to overcome this problem by increasing the glass transition temperature and lowering the thermal expansion coefficient of the resin so as to reduce the difference in shrinkage between the substrate and the resin, and thus minimize package warp. One specific solution involves using a polyfunctional epoxy resin, a phenolic novolac resin as the curing agent, and an imidazole compound as the curing accelerator in order to increase the glass transition temperature, and including also a large quantity of silica filler to lower thermal expansion. In order to enable high loading of silica filler while maintaining good flow characteristics, it is known to use all spherical silica particles free of fragments so as to optimize the particle size distribution of the filler. A method of treating silica with a coupling agent to optimize its surface state is also known.

Another important property when evaluating device reliability is the adhesion of the resin to the solder mask covering the substrate surface. It is well known in the art that adhesion of the resin to the solder mask can be dramatically enhanced by the judicious selection and use of an epoxy silane or mercaptosilane coupling agent.

Yet, the prior art described above was found to have a number of serious drawbacks. For instance, epoxy resin compositions using an imidazole compound as the curing accelerator have a shelf stability inferior to that of compositions using a phosphorus-containing accelerator, so that wire flow and incomplete filling due to a rapid rise in viscosity in the resin encapsulation step are more likely to arise. In addition, hydrolyzable chlorine within the epoxy resin is more readily extracted, which can be detrimental to device reliability in the presence of moisture. Furthermore, the steady increase in package size within the industry requires that further reductions be made in thermal expansion, but the high loadings of silica currently in use increase the viscosity of the composition, resulting in frequent wire flow.

A certain type of coupling agent slows the curing speed of the epoxy resin composition at the time of resin encapsulation, which can lead to an increase in package warp.

Effective solutions have not previously been found to these and other problems associated with prior-art resin compositions for BGA encapsulation.

SUMMARY OF THE INVENTION

It is, therefore, an object of the present invention to provide semiconductor encapsulating epoxy resin compositions which have good flow characteristics, shelf stability, and curing speed, and which cure into products having excellent adhesion, low package warp, infrequent wire flow, and excellent processing ease and moisture reliability. Another object of the invention is to provide semiconductor devices encapsulated with these compositions in a cured state.

We have found that the above problems with prior-art epoxy resin compositions can be resolved by combining and blending together as the essential components: (A) a polyfunctional epoxy of the general formula (1), (B) a polyfunctional phenolic resin curing agent of the general formula (2), (C) an organophosphorus curing accelerator of the general formula (3), (D) an aminosilane coupling agent of the general formula (4), and (E) an inorganic filler.

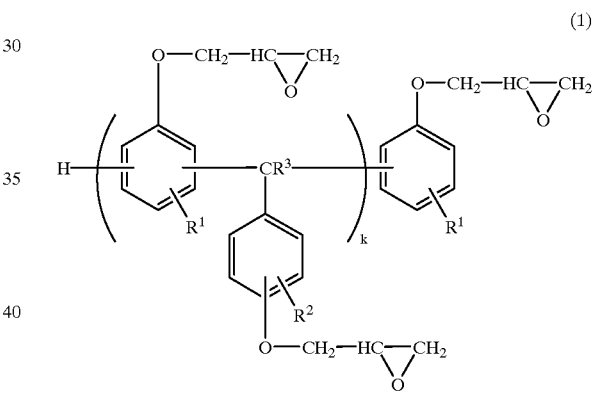

(1)

Herein, $R^1$ and $R^2$ are independently hydrogen atom, methyl group, or tert-butyl group; $R^3$ is hydrogen atom, methyl group, or ethyl group; and the letter k is an integer from 1 to 5.

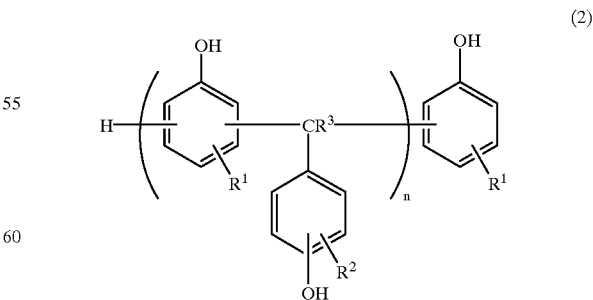

(2)

Herein, $R^1$, $R^2$ and $R^1$ have the same meaning as defined above, and the letter n is an integer from 1 to 5.

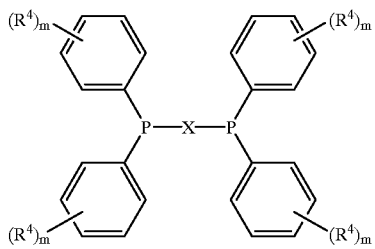

(3)

Herein, $R^4$ is independently hydrogen or alkyl or alkoxy groups having 1 to 4 carbon atoms, the letter m is an integer from 0 to 4, and X is —$(CH_2)_p$— or a group of the general formula (5):

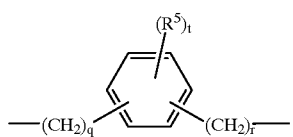

(5)

wherein p is an integer from 3 to 12, $R^5$ is independently hydrogen or alkyl or alkoxy groups having 1 to 4 carbon atoms; the letter t is an integer from 0 to 4; and q and r are each independently integers from 0 to 12.

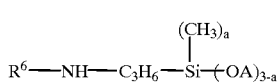

(4)

Herein, A is an alkyl or alkoxy-substituted alkyl group having 1 to 4 carbon atoms, the letter a is 0 or 1, and $R^6$ is hydrogen, —$C_2H_4NH_2$, or —$C_6H_5$.

The resulting epoxy resin composition has good flow characteristics, extended stability even when stored at high temperatures, and rapid curing speed. In addition, it provides a cured product that has excellent reliability in the presence of moisture and outstanding adhesion to the substrate, undergoes very little package warping even during BGA package encapsulation, and has a low wire flow incidence. These properties make the epoxy resin compositions of the invention highly suitable for use as BGA encapsulants and other similar applications.

Accordingly, the present invention provides an epoxy resin composition for semiconductor encapsulation comprising (A) a polyfunctional epoxy resin having formula (1), (B) a polyfunctional phenolic resin curing agent having formula (2), (C) an organophosphorus curing accelerator having formula (3), (D) an aminosilane coupling agent having formula (4), and (E) an inorganic filler. The invention also provides a semiconductor device encapsulated within this composition in a cured state.

DETAILED DESCRIPTION OF THE INVENTION

Figure 1:
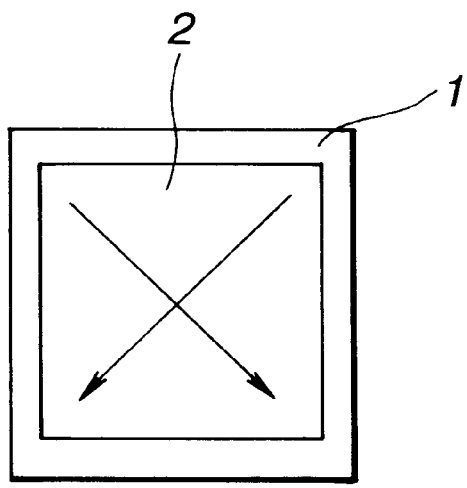
FIG. 1 is a schematic view of a BGA package used to measure the amount of package warp.

The semiconductor encapsulating epoxy resin composition of this invention includes, as a first essential component, (A) a polyfunctional epoxy resin of the general formula (1).

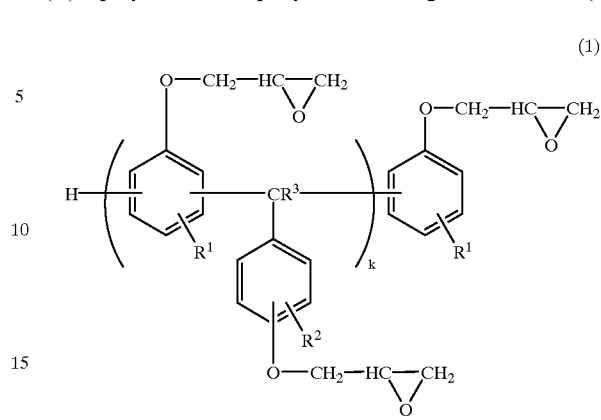

(1)

In formula (1), $R^1$ and $R^2$ are independently hydrogen atom, methyl group (—$CH_3$), or tert-butyl group (—$C(CH_3)_3$); $R^3$ is hydrogen atom, methyl group (—$CH_3$), or ethyl group (—$C_2H_5$), preferably hydrogen atom; and the letter k is an integer from 1 to 5, and preferably 1 to 3.

The polyfunctional epoxy resin of formula (1) is characterized by a high glass transition temperature (Tg) due to restricted molecular motion within the resin. BGA packages have a so-called bimetal construction in which a circuit board substrate composed of a glass-fiber laminate impregnated with an organic resin such as bismaleimide triazine (BT) resin is resin encapsulated on one side, making the package highly subject to warping. It is then necessary to reduce warpage by suitable selection of the resin. The amount of warp can be reduced by carrying out encapsulation using a resin composition having the same shrinkage factor, and thus substantially the same Tg and coefficient of thermal expansion, as the substrate. Epoxy resin compositions having a high Tg are desirable for this purpose, and can be obtained using the epoxy resin of formula (1) above.

The substituents $R^1$ and $R^2$ within the structure shown in formula (1) are each independently a hydrogen atom, —$CH_3$, —$C(CH_3)$, or a mixture thereof. A structure in which these substituents $R^1$ and $R^2$ are hydrogen atoms or —$CH_3$ groups is preferable for increasing the Tg of the cured resin composition, whereas a structure containing —$C(CH_3)_3$ substituents is best for achieving a low moisture absorption. The substituent $R^3$ in the structure of formula (1) is hydrogen atom, methyl group or ethyl group, preferably hydrogen atom.

The molecular weight of the polyfunctional epoxy resin of formula (1) is not subject to any particular limitation, although a molecular weight within a range of about 400 to about 1,200, and especially about 500 to about 800, is generally preferred. Nor is any particular limitation imposed on the epoxy equivalent, although it generally falls within a range of about 150 to about 300, and especially about 160 to about 200. This polyfunctional epoxy resin may be silicone modified.

To enhance the reliability of the encapsulated device in the presence of moisture, the levels of alkali metal, alkaline earth metal, halogen, and other ionic impurities in the epoxy resin of formula (1) should be as low as possible.

In the practice of the invention, epoxy resins other than the epoxy resin of formula (1) may also be included as part of the epoxy resin component of the semiconductor encapsulating composition. Illustrative examples of these other epoxy resins include novolac epoxy resins such as o-cresol novolac epoxy resins, and phenolic novolac epoxy resins; biphenyl epoxy resins; bisphenol epoxy resins such as bisphenol A epoxy resins, and bisphenol F epoxy resins; triphenolmethane epoxy resins other than those represented by the above formula (1); naphthalene epoxy resins; dicyclopentadiene-modified epoxy resins; phenol aralkyl epoxy resins; and biphenyl aralkyl epoxy resins.

The polyfunctional epoxy resin of formula (1) preferably represents at least 70% by weight, and more preferably 90 to 100% by weight, of the total amount of epoxy resin used in the inventive compositions. If the amount of the polyfunctional epoxy resin of formula (1) is less than 70% by weight and the amount of other epoxy resins is more than 30% by weight, the result is often a decline in Tg and increased warping of the BGA package.

A second essential component of the semiconductor encapsulating composition of the present invention is (B) a polyfunctional phenolic resin curing agent of the general formula (2):

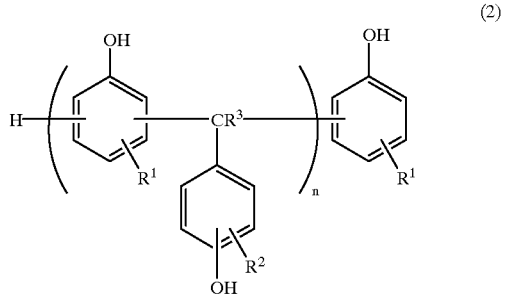

(2)

In formula (2), $R^1$ and $R^2$ are independently hydrogen atom, methyl group, or tert-butyl group, preferably hydrogen atom. $R^3$ is hydrogen atom, methyl group, or ethyl group, preferably hydrogen atom. The letter n is an integer from 1 to 5, and preferably from 1 to 3. The reasons for using this polyfunctional phenolic resin curing agent of formula (2) in the invention are the same as the reasons given above for the use of the polyfunctional epoxy resin of formula (1).

The polyfunctional phenolic resin curing agent of formula (2) may have any molecular weight, although a molecular weight within a range of about 200 to about 1,000, and especially about 300 to about 600, is generally preferred. No particular limitation is imposed on the hydroxyl equivalent, although it is generally within a range of about 100 to about 150, and especially about 110 to about 120. This phenolic resin curing agent may be a modified silicone.

To enhance device reliability in the presence of moisture, the levels of alkali metal, alkaline earth metal, halogen, and other ionic impurities in the polyfunctional phenolic resin curing agent resin of formula (2) should be as low as possible.

The curing agents used in the semiconductor encapsulating composition of the invention may include also phenolic resins other than the polyfunctional phenolic resins of formula (2). Illustrative examples of the other phenolic resins include novolac resins such as phenolic novolac resins, or cresol novolac resins; bisphenol phenolic resins such as bisphenol A resins, or bisphenol F resins; p-xylylene-modified phenolic resins; m-xylylene-modified phenol resins; o-xylylene-modified phenolic resins; triphenol alkane resins other than those represented by the above formula (2); naphthalene phenolic resins; dicyclopentadiene-modified phenolic resins; biphenyl phenolic resins; phenol aralkyl resins; and biphenyl aralkyl resins.

The amount of the polyfunctional phenolic resin of formula (2) is preferably at least 70% by weight, and more preferably 90 to 100% by weight, of the total amount of phenolic resin curing agents used in the compositions of the invention. If the amount of the polyfunctional phenolic resin of formula (2) is less than 70% by weight and the amount of other phenolic resin curing agents is more than 30% by weight, the result is often a decline in Tg and increased warping of the BGA package.

The phenolic resin curing agents are preferably formulated in an amount representing 25 to 40% by weight of the epoxy resins and the phenolic resin curing agents combined. At less than 25% by weight or more than 40% by weight, the difference between the number of epoxy groups in the epoxy resins and the number of hydroxyl groups in the phenolic resin curing agents would become too large, resulting in a decline in the curing speed of the composition that leads in turn to a cured product having a lower Tg and a higher linear expansion coefficient, the ultimate effect of which is greater warping of the BGA package. Therefore, the amount of phenolic resin curing agent included within the semiconductor encapsulating composition of the invention is preferably set such that the number of moles of phenolic hydroxyl groups in the phenolic resin per mole of epoxy groups in the epoxy resin falls within a range of preferably 0.5 to 1.5, and especially 0.8 to 1.2.

The curing accelerator (C) serving as another essential component of the present invention comprises an organophosphorus curing accelerator having the following general formula (3).

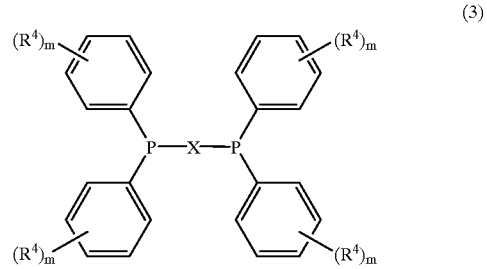

(3)

In formula (3), $R^4$ is independently hydrogen or alkyl or alkoxy groups having 1 to 4 carbon atoms. The letter m is an integer from 0 to 4. X is —$(CH_2)_p$— wherein p is an integer from 3 to 12 or a group of the general formula (5):

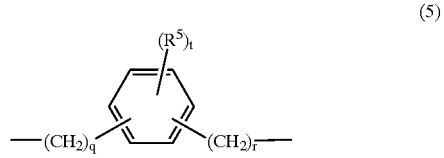

(5)

wherein $R^5$ is independently hydrogen, or alkyl or alkoxy groups having 1 to 4 carbon atoms, the letter t is an integer from 0 to 4, and q and r are each independently integers from 0 to 12, preferably 0 to 4, more preferably 0 or 1.

As noted above, $R^4$ in formula (3) is independently hydrogen or alkyl or alkoxy groups having 1 to 4 carbon atoms. Examples include hydrogen, methyl, ethyl, propyl, isopropyl, butyl, isobutyl, tert-butyl, methoxy, ethoxy, propoxy, isopropoxy, butoxy, isobutoxy, and tert-butoxy.

$R^5$ in formula (5) is exemplified by the same groups as mentioned above for $R^4$.

Illustrative examples of such organophosphorus compounds include the compounds having the following structural formulas.

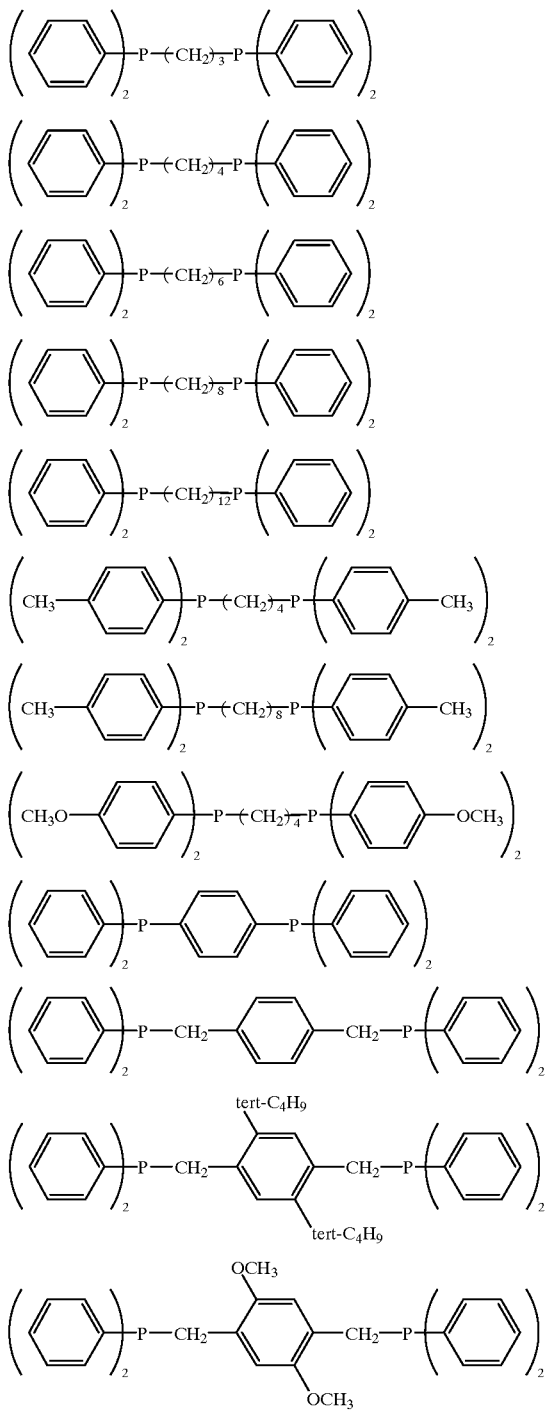

These curing accelerators may be used singly or in combinations of two or more. No limitation is imposed on the amount of their addition, although use within a range of 0.001 to 10 parts by weight, preferably 0.005 to 5 parts by weight, and especially 0.01 to 1 part by weight, per 100 parts of the epoxy resins and the curing agents combined, is advantageous. At less than 0.001 part by weight, the curing reaction tends to be incomplete and the composition would become less releasable from the mold. On the other hand, the use of more than parts by weight would result in too high a viscosity during molding, as well as poor device reliability such as moisture resistance.

If necessary, other known curing accelerators may be included together with the organophosphorus accelerators of formula (3). Illustrative examples of the other accelerators include organic phosphine compounds other than the phosphine compounds of formula (3) such as triphenylphosphine, tributylphosphine, tri(p-toluyl) phosphine, tri(p-methoxyphenyl)phosphine, tri(p-ethoxyphenyl)phosphine, and triphenylphosphine triphenylborate; quaternary phosphonium salts such as tetraphenylphosphonium tetraphenylborate; amine compounds such as tertiary amine compounds including triethylamine, benzyldimethylamine, α-methylbenzyldimethyl amine, and 1,8-diazabicyclo[5.4.0] undecene and other cycloamidine compounds; and imidazoles such as 2-methylimidazole, 2-ethylimidazole, 2-ethyl-4-methylimidazole, 2-ethyl-4,5-dimethylimidazole, 2-phenylimidazole, 2-phenyl-4-methylimidazole, 2-phenyl-4,5-dimethylimidazole, 2-phenyl-4-hydroxymethylimidazole, 2-phenyl-4,5-di(hydroxymethyl) imidazole. The other accelerators may be used in conventional amounts within a range that allows the objects of the invention to be attained. Usually, the accelerators may be used in an amount of 0 to 5 parts by weight, preferably 0 to 1 part by weight per 100 parts by weight of the total of the epoxy resins and the phenolic resins.

The above-described curing accelerators may be premixed with the resin components and milled for easier dispersion within the resin composition.

The semiconductor encapsulating composition of the invention includes also, as an essential component, (D) a silane coupling agent comprising an aminosilane coupling agent of the general formula (4).

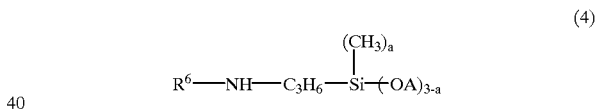

(4)

Herein, A is an alkyl or alkoxy-substituted alkyl group having 1 to 4 carbon atoms, the letter a is 0 or 1, and $R^6$ is hydrogen, $—C_2H_4NH_2$, or $—C_6H_5$.

Examples of alkyl or alkoxy-substituted alkyl groups represented by A include methyl, ethyl, propyl, isopropyl, butyl, isobutyl, tert-butyl, methoxymethyl, ethoxymethyl, methoxyethyl, and ethoxyethyl.

The compounds of formula (4) have a good affinity, not only with the epoxy resin and the phenolic resin curing agent in the resin composition, but also with organic components such as a solder mask on the BGA package substrate and the surface of inorganic components such as silica. Hence, these compounds are well dispersible in the resin composition. As a result, they improve the wettability of the silica filler by the organic resin, and thus considerably enhance the flow characteristics of the resin composition, the bond strength at the organic resin-silica filler interface, and the bond strength between the resin composition and the solder mask. These properties make it possible to lower the viscosity of the resin composition, thereby preventing wire flow. Moreover, the improved bond strength leads to a better device reliability at the time of solder immersion.

Examples of suitable aminosilane coupling agents include the following compounds: $(CH_3O)_3SiC_3H_6NHC_2H_4NH_2$, $(C_2H_5O)_3SiC_3H_6NHC_2H_4NH_2$, $(CH_3O)_3SiC_3H_6NH_2$, $(C_2H_5O)_3SiC_3H_6NH_2$, $(CH_3O)_3SiC_3H_6NHC_6H_5$,

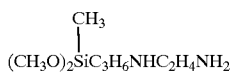

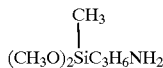

and $(C_2H_5O)_3SiC_3H_6NHC_6H_5$.

No particular limitation is imposed on the amount of aminosilane coupling agent having formula (4), although it is generally preferable for this amount to be within a range of 0.2 to 3 parts by weight, and especially 0.15 to 1.5 parts by weight, per 100 parts by weight of the epoxy resin and the curing agent combined.

Other types of coupling agents may be used together with the aminosilane coupling agent of formula (4) in order to provide a better balance with other required capabilities. Examples of other coupling agents that may be used include silane coupling agents containing epoxy groups or mercapto groups, such as γ-glycidoxypropyltrimethoxysilane and mercaptopropyltrimethoxysilane. The amount of other coupling agents, if added, is preferably adjusted so that the proportion of the aminosilane coupling agent of formula (4) represents at least 30% by weight, and especially 50 to 70% by weight, of the total amount of coupling agent. At less than 30% by weight, the composition loses adhesion because of the reduced affinity to organic components such as the solder mask on the BGA package substrate and the surface of inorganic components such as silica, and the composition increases in melt viscosity, becoming a cause of wire flow during molding.

The semiconductor encapsulating epoxy resin composition of this invention further includes an inorganic filler (E) to reduce the thermal expansion coefficient of the encapsulant and thus lower stresses acting upon the semiconductor device.

This filler may be of the same type as the inorganic fillers employed in conventional epoxy resin compositions. Use is often made of fused silica in ground or spherical form, or crystalline silica. Other inorganic fillers such as alumina, silicon nitride, aluminum nitride, boron nitride, titanium oxide, and glass fibers are also suitable for this purpose.

The use of the inorganic filler either as a blend of spherical and ground material or in the spherical form only is preferable for achieving both lower thermal expansion of the cured product as well as moldability. Advantageously, the inorganic filler will have a mean particle size within a range of to microns. The mean particle size can be determined as a weight mean diameter or median diameter by a particle size distribution measuring device based on such a process as laser light diffraction process.

The inorganic filler included within the inventive composition is preferably one that has been surface treated beforehand with a silane coupling agent or the like in order to increase the bonding strength between the resin and the surface of the inorganic filler. No particular limitations are imposed on the surface treatment method and the amount of coupling agent used in surface treatment.

There is no particular limit on the amount of this inorganic filler component (E) used in the inventive composition, although the use of about 200 to 1,200 parts by weight, and especially about 400 to 1,000 parts by weight, per 100 parts by weight of the epoxy resin and the curing agent combined is preferred. At less than 200 parts by weight, the thermal expansion coefficient of the cured resin composition becomes high, causing greater stress on the semiconductor device to deteriorate the characteristics thereof. On the other hand, compositions containing more than 1,200 parts by weight have an increased viscosity during molding and are difficult to mold.

In addition to the components described above, the epoxy resin compositions of the invention may also include, where necessary, colorants such as carbon black, flame retardants such as brominated epoxy resins and antimony trioxide, and stress-reducing ingredients such as silicone oil, silicone rubber, and copolymers of an organopolysiloxane and an aromatic group-containing resin including an epoxy resin and phenolic resin. These optional ingredients may be added in conventional amounts within ranges that allow the objects of the invention to be achieved.

The inventive composition may be prepared as a molding material by mixing the above-described epoxy resin, phenolic resin curing agent, aminosilane coupling agent, inorganic filler, curing accelerator, and other optional ingredients at room temperature in a mixer, working the resulting mixture in an ordinary apparatus suitable for the purpose, such as a roll mill or an extruder, cooling, then pulverizing. Curing may be carried out at 165 to 185° C. for a period of about 1 to 3 minutes, and post-curing may be effected at 170 to 180° C. for a period of about 4 to 8 hours.

The semiconductor encapsulating epoxy resin compositions of the present invention have good flow characteristics, shelf stability, and curing speed, in addition to which they form cured products characterized by good adhesion to the solder mask, minimal warping of the BGA package, very little wire flow, and outstanding ease of processing and reliability. These qualities make them ideal for use as BGA package encapsulants and related applications.

EXAMPLE

Examples are given below to illustrate the invention, and are not intended to limit the scope thereof. All parts are by weight.

Examples 1–6 & Comparative Examples 1–5

Eleven semiconductor encapsulating epoxy resin compositions were prepared by melting and uniformly mixing together the ingredients shown in Tables 1 and 2 in a hot two-roll mill, cooling the resulting mixture, then pulverizing. The epoxy resins, phenolic resin curing agents, curing accelerators, and silane coupling agents used had the structural formulas shown below.

Epoxy Resin 1 (Average formula)

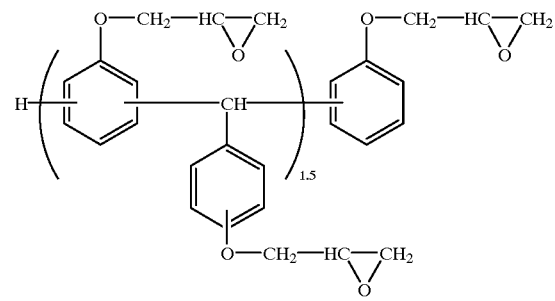

Epoxy Resin 2 (Average formula)

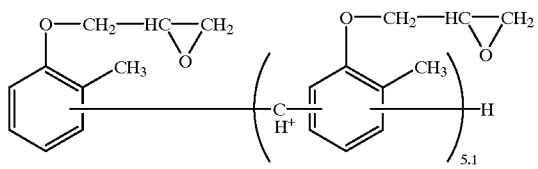

Phenolic Resin Curing Agent 1 (Average formula)

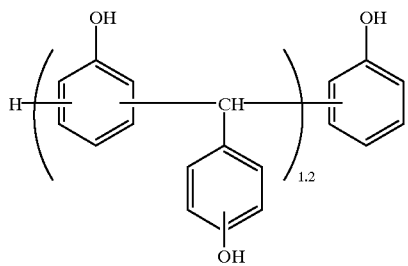

Phenolic Resin Curing Agent 2 (Average formula)

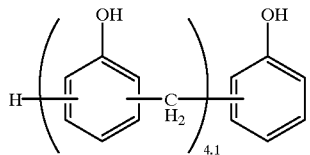

Curing Accelerator 1

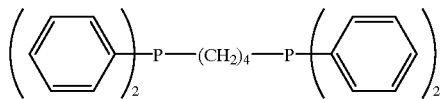

Curing Accelerator 2

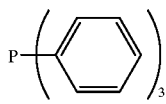

Curing Accelerator 3

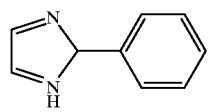

Silane Coupling Agent 1

$(CH_3O)_3SiC_3H_6NHC_6H_5$

Silane Coupling Agent 2

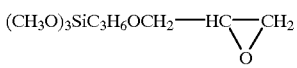

Silane Coupling Agent 3

$(CH_3O)_3SiC_3H_6SH$

Properties (1) to (8) below were measured for each of these epoxy resin compositions. The results are presented in Tables 1 and 2.

(1) Spiral Flow:

The spiral flow was measured by molding each composition in a mold in accordance with EMMI standards at a temperature of 175° C. and a pressure of 70 kgf/mm² and for a time of 90 seconds.

(2) Gel Time:

The gel time for each composition was measured on a hot plate at 175° C.

(3) Melt Viscosity:

The melt viscosity was measured at 175° C. using a constant-load, orifice-type flow testing apparatus of the kind known in Japan as a Koka-type flow tester (Shimazu Mfg. K.K.)

(4) Hardness When Hot:

In accordance with JIS K-6944, each composition was molded and cured at 175° C. and 70 kgf/mm² for a time of 60 seconds into a part with dimensions of 4×10×100 mm, which was measured for hardness when hot using a Barcol Impressor.

(5) Glass Transition Temperature (Tg) and Linear Expansion Coefficient ($\alpha 1$ and $\alpha 2$):

Test specimens with dimensions of 5×5×15 mm were obtained by molding each composition at 175° C. and 70 kgf/mm² for a time of 90 seconds and post-curing at 180° C. for 4 hours. Measurement of both properties was carried out by raising the temperature of the test specimen at a rate of 5° C./min in a dilatometer.

(6) Shelf Stability:

The epoxy resin composition was placed in a sealed aluminum pouch and left to stand at 25° C. for 72 hours in a constant-temperature chamber. The spiral flow of the aged composition was measured as in (1) above, and a percentage decrease in the aged value relative to the initial value was calculated.

(7) Package Warpage:

A BGA package as shown in FIG. 1 was fabricated by molding the encapsulating resin as a test specimen 2 having dimensions of 5×5×15 mm over a chip-mounted circuit board substrate 1. The amount of warping on the molded resin side of the package was then measured using a laser-type waviness tester (Yasunaga K.K.). After 4 hours of post-curing at 180° C., measurement was repeated again. The measurement conditions are given below.

Measurement method: Waviness tester ($\mu$m)

Package dimensions without chip: 35×35 mm

Number of samples: 3

Warpage: average of 3 samples

Molding temperature: 175° C.

Molding time: 90 seconds

Post-cure: 4 hours at 180° C.

Figure 2:
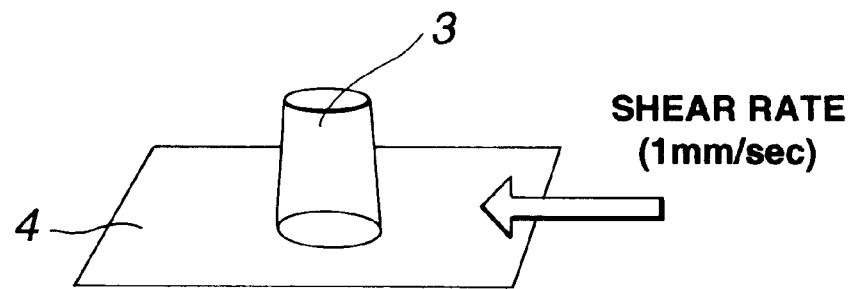
FIG. 2 is a schematic view of an adhesion test sample used to measure adhesion to the substrate.

(8) Adhesion to Substrate:

An adhesion test specimen 3 was formed on a substrate 4 as shown in FIG. 2 by molding the epoxy composition at 175° C. and 70 kgf/mm² for a time of 90 seconds and post-curing at 180° C. for 4 hours. The shear bond strength was measured using a push-pull gauge. The measurement conditions are given below.

Measurement method: Shear bond strength (kgf) at shear rate of 1 mm/sec

Substrate: PSR 4000 AUS 5-coated BT plate Surface area of adhesion: 10 mm$^2$

Number of samples: 8

Adhesive strength: average of 8 samples

Molding temperature: 175° C.

Molding time: 90 seconds

Post-cure: 4 hours at 180° C.

Deterioration test conditions: 85° C., 85% RH for 72 hours; two IR reflow soldering cycles

TABLE 1

| | Ex. 1 | Ex. 2 | Ex. 3 | Ex. 4 | Ex. 5 | Ex. 6 |
|---|---|---|---|---|---|---|
| Ingredients (pbw) | | | | | | |
| Epoxy resin 1 | 57.2 | 57.2 | 57.2 | 57.2 | 51.5 | 57.2 |
| Epoxy resin 2 | | | | | 5.7 | |
| Phenolic resin curing agent 1 | 32.4 | 32.4 | 32.4 | 32.4 | 32.4 | 29.2 |
| Phenolic resin curing agent 2 | | | | | | 3.2 |
| Curing accelerator 1 | 0.8 | 0.8 | 0.8 | 0.5 | 0.8 | 0.8 |
| Curing accelerator 2 | | | | 0.3 | | |
| Curing accelerator 3 | | | | | | |
| Silane coupling agent 1 | 1.0 | 0.7 | 0.7 | 1.0 | 1.0 | 1.0 |
| Silane coupling agent 2 | | 0.3 | | | | |
| Silane coupling agent 3 | | | 0.3 | | | |
| Brominated phenolic novolac epoxy resin | 8.0 | 8.0 | 8.0 | 8.0 | 8.0 | 8.0 |
| Spherical silica (mean particle size, 15 μm) | 600 | 600 | 600 | 600 | 600 | 600 |
| Carbon black | 3 | 3 | 3 | 3 | 3 | 3 |
| Antimony trioxide | 5 | 5 | 5 | 5 | 5 | 5 |
| Carnauba wax | 3 | 3 | 3 | 3 | 3 | 3 |
| Properties | | | | | | |
| Spiral flow (inch) | 40 | 39 | 44 | 41 | 37 | 36 |
| Gel time (sec) | 18 | 19 | 20 | 18 | 18 | 18 |
| Melt viscosity (poise) | 100 | 90 | 100 | 120 | 150 | 160 |
| Hardness when hot | 83 | 81 | 75 | 78 | 80 | 81 |
| Tg (° C.) | 185 | 183 | 177 | 180 | 181 | 180 |
| $\alpha_1$ ($10^{-5}$/° C.) | 1.2 | 1.2 | 1.2 | 1.2 | 1.2 | 1.2 |
| $\alpha_2$ ($10^{-5}$/° C.) | 3.8 | 3.8 | 3.8 | 3.8 | 3.8 | 3.8 |
| Shelf stability (%) | 90 | 92 | 90 | 91 | 89 | 89 |
| Package warpage (μm) | 20 | 23 | 32 | 25 | 45 | 43 |
| Adhesion to substrate (kgf) | 7.5 | 8.2 | 7.2 | 7.4 | 7.5 | 7.8 |

TABLE 2

| | CE 1 | CE 2 | CE 3 | CE 4 | CE 5 |
|---|---|---|---|---|---|
| Ingredients (pbw) | | | | | |
| Epoxy resin 1 | 57.2 | 57.2 | 57.2 | | 57.2 |
| Epoxy resin 2 | | | | 57.2 | |
| Phenolic resin curing agent 1 | 32.4 | 32.4 | 32.4 | 32.4 | |
| Phenolic resin curing agent 2 | | | | | 32.4 |
| Curing accelerator 1 | | 0.8 | 0.8 | 0.8 | 0.8 |
| Curing accelerator 2 | | | | | |
| Curing accelerator 3 | 0.8 | | | | |
| Silane coupling agent 1 | 1.0 | | | 1.0 | 1.0 |
| Silane coupling agent 2 | | | | | |
| Silane coupling agent 3 | | 1.0 | | | |
| Brominated phenolic novolac epoxy resin | 8.0 | 8.0 | 8.0 | 8.0 | 8.0 |
| Spherical silica (mean particle size, 15 μm) | 600 | 600 | 600 | 600 | 600 |
| Carbon black | 3 | 3 | 3 | 3 | 3 |
| Antimony trioxide | 5 | 5 | 5 | 5 | 5 |
| Carnauba wax | 3 | 3 | 3 | 3 | 3 |
| Properties | | | | | |
| Spiral flow (inch) | 32 | 35 | 33 | 29 | 25 |
| Gel time (sec) | 15 | 20 | 19 | 22 | 25 |
| Melt viscosity (poise) | 250 | 220 | 220 | 310 | 330 |
| Hardness when hot | 83 | 65 | 82 | 71 | 70 |
| Tg (° C.) | 187 | 180 | 184 | 159 | 154 |

TABLE 2-continued

| | CE 1 | CE 2 | CE 3 | CE 4 | CE 5 |
|---|---|---|---|---|---|
| $\alpha_1$ ($10^{-5}$/° C.) | 1.2 | 1.2 | 1.2 | 1.2 | 1.2 |
| $\alpha_2$ ($10^{-5}$/° C.) | 3.8 | 3.8 | 3.8 | 3.6 | 3.5 |
| Shelf stability (%) | 56 | 88 | 88 | 80 | 78 |
| Package warpage (μm) | 25 | 89 | 25 | 120 | 135 |
| Adhesion to substrate (kgf) | 7.3 | 6.5 | 2.1 | 5.5 | 6.1 |

As is apparent from the results in Tables 1 and 2, the epoxy resin compositions according to the present invention which include a specific epoxy resin, a phenolic resin curing agent, a curing accelerator, a silane coupling agent, and an inorganic filler are endowed with good flow properties, a rapid cure rate, excellent shelf stability, and a high Tg. Moreover, when the inventive compositions are cured, warping of BGA packages encapsulated therewith is minimal, and adhesion to the solder mask is good. Semiconductor devices encapsulated with the inventive compositions were confirmed to have excellent cracking resistance during reflow soldering. The encapsulated devices are thus highly reliable.

Japanese Patent Application No. 016353/1998 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A semiconductor encapsulating epoxy resin composition comprising:

(A) a polyfunctional epoxy of the general formula (1):

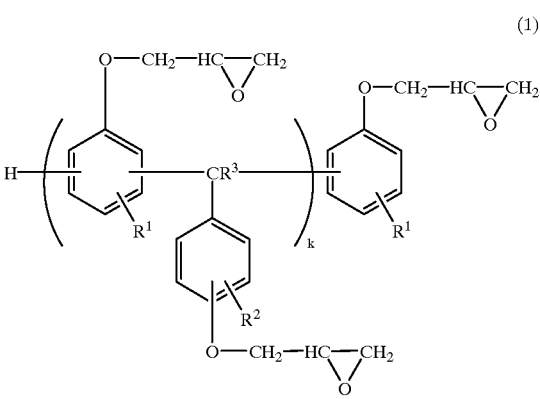

wherein $R^1$ and $R^2$ are independently hydrogen atom, methyl group, or tert-butyl group; $R^3$ is hydrogen atom, methyl group, or ethyl group; and the letter k is an integer from 1 to 5;

(B) a polyfunctional phenolic resin curing agent of the general formula (2):

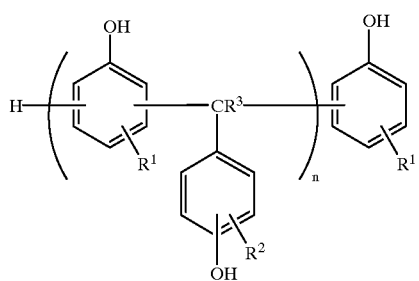

(2)

wherein $R^1$ and $R^2$ are independently hydrogen atom, methyl group, or tert-butyl group; $R^3$ is hydrogen atom, methyl group, or ethyl group; and the letter n is an integer from 1 to 5;

(C) an organophosphorus curing accelerator of the general formula (3):

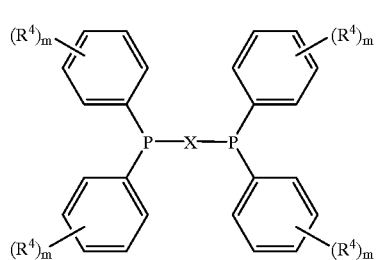

(3)

wherein $R^4$ is independently hydrogen or alkyl or alkoxy groups having 1 to 4 carbon atoms, the letter m is an integer from 0 to 4, and X is —$(CH_2)_p$— wherein p is an integer from 3 to 12 or a group of the general formula (5):

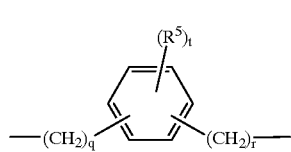

(5)

wherein $R^5$ is independently hydrogen or alkyl or alkoxy groups having 1 to 4 carbon atoms; the letter t is an integer from 0 to 4; and q and r are each independently integers from 0 to 12;

(D) an aminosilane coupling agent of the general formula (4):

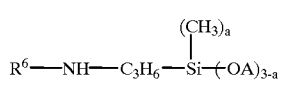

(4)

wherein A is an alkyl or alkoxy-substituted alkyl group having 1 to 4 carbon atoms, the letter a is 0 or 1, and $R^6$ is hydrogen, —$C_2H_4NH_2$, or —$C_6H_5$; and (E) an inorganic filler.

2. A semiconductor device encapsulated with the epoxy resin composition of claim 1 in a cured state.

* * * * *